(12) United States Patent
Zhou et al.

(10) Patent No.: US 10,459,042 B2
(45) Date of Patent: Oct. 29, 2019

(54) MAGNETORESISTIVE RELAY

(71) Applicant: MultiDimension Technology Co., Ltd., Zhangjiagang (CN)

(72) Inventors: Zhimin Zhou, Zhangjiagang (CN); James Geza Deak, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 84 days.

(21) Appl. No.: 15/749,666

(22) PCT Filed: Aug. 11, 2016

(86) PCT No.: PCT/CN2016/094587
§ 371 (c)(1),
(2) Date: Feb. 1, 2018

(87) PCT Pub. No.: WO2017/025044
PCT Pub. Date: Feb. 16, 2017

(65) Prior Publication Data
US 2018/0224509 A1    Aug. 9, 2018

(30) Foreign Application Priority Data

Aug. 12, 2015 (CN) .......................... 2015 1 0493695

(51) Int. Cl.
*H03K 17/90* (2006.01)
*G01R 33/09* (2006.01)
(Continued)

(52) U.S. Cl.
CPC ............. *G01R 33/09* (2013.01); *H01H 47/02* (2013.01); *H01L 43/08* (2013.01); *H03K 17/689* (2013.01); *H03K 17/90* (2013.01)

(58) Field of Classification Search
CPC .................................................... H03K 17/90
See application file for complete search history.

(56) References Cited

FOREIGN PATENT DOCUMENTS

| CN | 103384141 | 11/2013 |
|----|-----------|---------|
| CN | 104065367 | 9/2014  |

(Continued)

OTHER PUBLICATIONS

"International Application No. PCT/CN2016/094587, International Search Report and Written Opinion dated Nov. 21, 2016", (Nov. 21, 2016), 10 pgs.

*Primary Examiner* — Ramon M Barrera
(74) *Attorney, Agent, or Firm* — Schwegman Lundberg & Woessner, P.A.

(57) ABSTRACT

A magnetoresistive relay, comprising a substrate, a magnetic excitation coil, a magnetoresistive sensor, and switch integrated circuit which are placed on a substrate, which further includes an excitation signal input electrode, an excitation signal output electrode, a switch circuit positive output electrode, a switch circuit negative output electrode, a power input electrode, and a ground electrode. The ends of the magnetic excitation coil are each connected with the excitation signal input electrode and the excitation signal output electrodes. The signal from the magnetoresistive sensor is sent to the switch integrated circuit. The positive switch circuit output electrode and the switch circuit negative electrode are respectively connected with the switch integrated circuit. The power input ends and the ground ends of the switch integrated circuit and the magnetoresistive sensor are respectively connected with the power input electrode and the ground electrode. During operation, the magnetic field from the excitation coil provides an on/off signal, and this signal is used to change the magnetoresistance of the magnetoresistive sensor, the switch integrated circuit receives the signal from the magnetoresistive sensor, and from this the external output switching action is realized. This magnetoresistive relay is easy to operate, and it has low power consumption, small size, and long life span.

17 Claims, 7 Drawing Sheets

(51) Int. Cl.
*H01H 47/02* (2006.01)
*H01L 43/08* (2006.01)
*H03K 17/689* (2006.01)

(56) References Cited

FOREIGN PATENT DOCUMENTS

| | | |
|---|---|---|
| CN | 105185655 | 12/2015 |
| CN | 204991599 | 1/2016 |
| WO | WO-2014156751 | 10/2014 |
| WO | WO-2017025044 | 2/2017 |

MAGNETORESISTIVE RELAY

PRIORITY CLAIM TO RELATED APPLICATIONS

This application is a U.S. national stage application filed under 35 U.S.C. § 371 from International Application Serial No. PCT/CN2016/094587, which was filed 11 Aug. 2016, and published as WO2017/025044 on 16 Feb. 2017, and which claims priority to Chinese Application No. 201510493695.6, filed 12 Aug. 2015, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a magnetoresistive relay.

BACKGROUND ART

A relay, as a common electronic device, is configured to control the on/off of a circuit. A common relay includes a mechanical electronic relay, which generates an electromagnetic field by using an excitation coil to act on a relay armature, so as to control the on/off of a circuit by controlling the on/off of the armature. The biggest problem of the mechanical electronic relay is that it relies on the mechanical on and off of the armature, thus easily causing impacts, and having a limited life span.

Another common relay further includes a reed switch relay. By applying an electromagnetic field to a reed switch, the reed switch is turned off when the electromagnetic field is enabled, so that the circuit is switched on. When the magnetic field is less than the enabled magnetic field, the reed switch is turned off. The reed switch relay is also of a mechanical on/off type, and likewise easily causes impacts.

Similar to the reed switch, a magnetoresistive sensor can also be designed as a magnetoresistive switch, being advantageous in that the magnetoresistive switch does not have the problem of the mechanical on/off, and the on/off is controlled by using an electronic switch. Therefore, the theoretical service life can be infinite. As a result, if the magnetoresistive switch is made into a magnetoresistive relay by using an integrated electromagnetic coil, it can be used to replace the reed switch and will be superior to the reed switch relay in terms of performance. Moreover, the magnetoresistive switch further has the following problem that a common magnetoresistive switch outputs digital signals, including high-level signals and low-level signals. The magnetoresistive switch applicable to the relay needs to be designed to simulate on/off signals, can implement access to and control over an external circuit, and has a large-power function.

SUMMARY OF THE INVENTION

The present invention provides a magnetoresistive relay that is designed to simulate on/off signals, can implement access to and control over an external circuit, and has a large-power function.

A magnetoresistive relay provided in the present invention includes a substrate and a magnetic excitation coil, a magnetoresistive sensor, and a switch integrated circuit which are placed on the substrate, and further includes an excitation signal input electrode, an excitation signal output electrode, a switch circuit positive output electrode, a switch circuit negative output electrode, a power input electrode, and a ground electrode, wherein the ends of the magnetic excitation coil are each connected with the excitation signal input electrode and the excitation signal output electrodes, the switch circuit positive output electrode and the switch circuit negative output electrode are respectively connected with the switch integrated circuit, and the power input ends and the ground ends of the switch integrated circuit and the magnetoresistive sensor are respectively connected with the power input electrode and the ground electrode; during operation, the magnetic field from the excitation coil provides an on/off signal, and this signal is used to change the magnetoresistance of the magnetoresistive sensor, the switch integrated circuit receives the signal from the magnetoresistive sensor, and from this the external output switching action is realized.

The magnetoresistive sensor is a TMR, a GMR, or an AMR magnetoresistive sensor.

The magnetoresistive sensor is a reference bridge magnetoresistive sensor or a push-pull bridge magnetoresistive sensor.

The reference bridge magnetoresistive sensor or the push-pull bridge magnetoresistive sensor is of a full-bridge, half-bridge, or quasi-bridge structure.

The magnetic excitation coil is a planar coil or a three-dimensional coil.

The planar coil is a spiral coil, including two regions having opposite current directions, wherein either of the regions includes N elongated straight wires arranged in parallel, the elongated straight wires have identical lengths and widths, and the elongated straight wires are separated by identical intervals, N being a positive integer.

A push arm and a pull arm of the push-pull magnetoresistive sensor are placed in the two regions of the spiral coil respectively. The push arm and the pull arm each include M magnetoresistive sensing unit strings. Any of the magnetoresistive sensing unit strings includes K magnetoresistive sensing units, and M*K magnetoresistive sensing units are interconnected to form a two-port structure. Sensitive axes of the magnetoresistive sensing units are perpendicular to the elongated straight wires of the region, and the position relationship between the magnetoresistive sensing units of the push arm in the corresponding region and the N elongated straight wires arranged in parallel is the same as the position relationship between the magnetoresistive sensing units of the pull arm in the corresponding region and the elongated straight wires arranged in parallel, M and K both being positive integers.

A reference arm and a sensitive arm of the reference bridge magnetoresistive sensor are both placed in a central region of the spiral coil. There is no wire in the central region, and a soft ferromagnetic flux shielding layer covers the reference arm.

The planar coil includes N elongated straight wires 1 and elongated straight wires 2 that are arranged alternately. The elongated straight wires 1 and the elongated straight wires 2 are parallel to each other, and any two adjacent elongated straight wires are separated by identical intervals. The ends of the adjacent elongated straight wires 1 and elongated straight wires 2 are connected in series. The elongated straight wires 1 and the elongated straight wires 2 have identical sizes but opposite current directions.

The push-pull magnetoresistive sensor includes a push magnetoresistive sensing unit string and a pull magnetoresistive sensing unit string. The push magnetoresistive sensing unit string and the pull magnetoresistive sensing unit string are placed above or below the elongated straight wires 1 and the elongated straight wires 2 alternately.

The reference bridge magnetoresistive sensor includes a reference magnetoresistive sensing unit string and a sensitive magnetoresistive sensing unit string; the sensitive magnetoresistive sensing unit string is placed directly above or directly below a middle position of the adjacent elongated straight wire 1 and elongated straight wire 2, and the sensitive magnetoresistive sensing unit string is placed directly above or directly below the elongated straight wire 1 or elongated straight wire 2.

A magnetic shielding layer is further included. The magnetoresistive sensor is placed between the magnetic shielding layer and the magnetic excitation coil.

The three-dimensional coil is a solenoid coil, and the reference bridge magnetoresistive sensor includes a reference magnetoresistive sensing unit string and a sensitive magnetoresistive sensing unit string. The reference magnetoresistive sensing unit string and the sensitive magnetoresistive sensing unit string are placed separately along the axis of the solenoid.

The three-dimensional coil includes two solenoid coils connected in series, and the two solenoid coils having opposite winding directions. The push-pull magnetoresistive sensor includes a push magnetoresistive sensing unit string and a pull magnetoresistive sensing unit string. The push magnetoresistive sensing unit string and the pull magnetoresistive sensing unit string are placed separately along the axes of the two solenoids.

If the operation mode of the magnetoresistive relay is a single-point operation mode, the switch integrated circuit switches from an off state to an on state only when the forward current of the excitation coil is greater than Ion-off, and the switch integrated circuit switches from the on state to the off state only when the forward current of the excitation coil is less than Ion-off;

or, if the operation mode of the magnetoresistive relay is a bipolar operation mode, the switch integrated circuit switches from an off state to an on state only when the forward current of the excitation coil is greater than Ion, and the switch integrated circuit switches from the on state to the off state only when the forward current of the excitation coil is less than Ioff;

or, if the operation mode of the magnetoresistive relay is a unipolar operation mode, the switch integrated circuit switches from an off state to an on state only when the forward current of the excitation coil is greater than Ion, and the switch integrated circuit switches from the on state to the off state only when the reverse current of the excitation coil is greater than Ioff;

or, if the operation mode of the magnetoresistive relay is an omnipolar operation mode, the switch integrated circuit switches from an off state to an on state when the forward current of the excitation coil is greater than Ion1, and the switch integrated circuit switches from the on state to the off state when the forward current of the excitation coil is less than Ioff1; or the switch integrated circuit switches from an off state to an on state when the reverse current of the excitation coil is greater than −Ion1, and the switch integrated circuit switches from the on state to the off state when the reverse current of the excitation coil is less than −Ioff1.

The switch integrated circuit includes a low-pass filter, an amplifier, a comparator, a drive latch control circuit, and an MOSFET tube. The low-pass filter is connected with an output signal of the magnetoresistive sensor, the amplifier is connected with the low-pass filter, and the comparator is connected with the amplifier; an output result of the comparator is transmitted to the drive latch control circuit, and the drive latch control circuit drives the on/off of the MOSFET tube; and the MOSFET is connected with the external circuit.

There are two MOSFET tubes. The gates of the two MOSFET tubes are interconnected. A source of one of the MOSFET tubes is interconnected with a drain of the other MOSFET tube, and the two interconnected gates are connected with the drive latch control circuit respectively. The remaining source and drain ends of the two MOSFET tubes are connected with the external circuit.

DETAILED DESCRIPTION

The present invention will be described in detail with reference to the accompanying drawings and embodiments.

Embodiment 1

Figure 1:
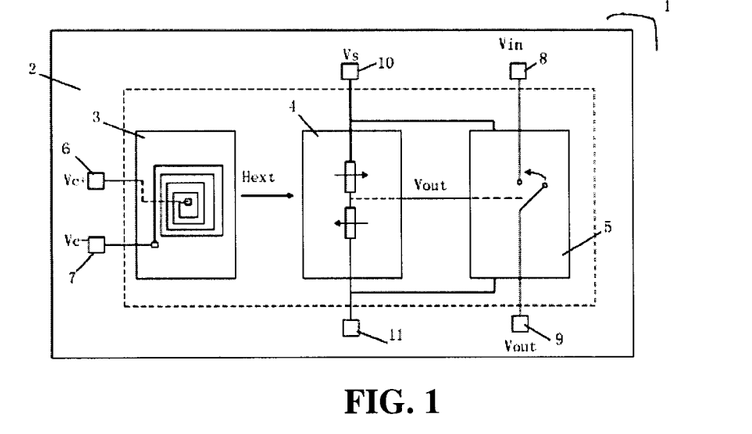
FIG. 1 is a schematic diagram of a magnetoresistive relay.

FIG. 1 is a structural diagram of a magnetoresistive relay 1, including a substrate 2 and a magnetic excitation coil 3, a magnetoresistive sensor 4, and a switch integrated circuit 5 which are placed on the substrate 2, and further including an excitation signal input electrode 6, an output electrode 7, a switch circuit positive output electrode 8, an output electrode 9, a power input electrode 10, and a ground electrode 11. The ends of the magnetic excitation coil 3 are each connected with the excitation signal input electrode 6 and the excitation signal output electrode 7. The signal from the magnetoresistive sensor 4 is sent to the switch integrated circuit 5. The positive switch circuit output electrode 8 and the switch circuit negative electrode 9 are respectively connected with the switch integrated circuit 5. The power input ends and the ground ends of the magnetoresistive sensor 4 are respectively connected with the power input electrode 10 and the ground electrode 11. The power input ends and the ground ends of the switch integrated circuit 5 are respectively connected with the power input electrode 10 and the ground electrode 11. The principle is that, the magnetic field from the excitation coil 3 provides a magnetic excitation field signal Hex, and this signal is used to change the magnetoresistance of the magnetoresistive sensor 4, the switch integrated circuit 5 receives an output signal Vout from the magnetoresistive sensor, and the switch integrated circuit 5 realizes the external output switching action according to the signal of the excitation coil 3.

Embodiment 2

Figure 2:
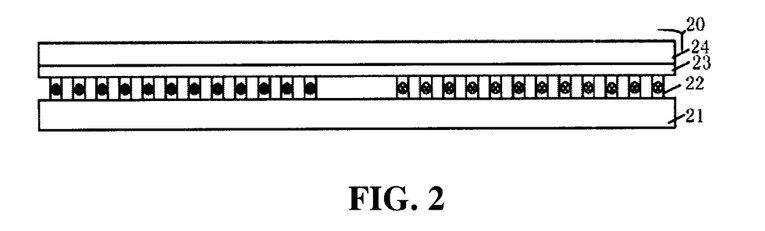
FIG. 2 is a first sectional diagram of a magnetoresistive relay.
Figure 3:
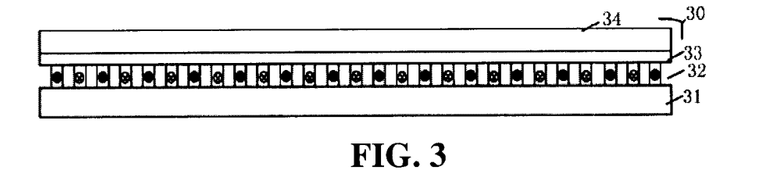
FIG. 3 is a second sectional diagram of a magnetoresistive relay.

FIG. 2 and FIG. 3 are two sectional diagrams of a magnetoresistive relay respectively. Structure of the magnetoresistive sensors in FIG. 2 and FIG. 3 include substrates 21 and 31, planar coils 22 and 32 placed on the substrates, magnetoresistive sensors 23 and 33 placed on upper surfaces of the planar coils 22 and 32, and magnetic shielding layers 24 and 34 placed above the magnetoresistive sensors 23 and 33. The magnetoresistive sensor is placed between the excitation coil and the magnetic shielding plate. Therefore, another possible sequence may be that a magnetic shielding layer, a magnetoresistive sensor, and an excitation coil are sequentially placed on a substrate. The difference between FIG. 2 and FIG. 3 is the difference between structures of the excitation coils 22 and 32. In FIG. 2, the coil 22 is of a spiral structure, and with respect to a central region, coil wires at two sides have opposite current directions, and coil wires at the same side have identical current directions. However, in FIG. 3, adjacent coil wires have opposite circuit directions.

Embodiment 3

Figure 4:
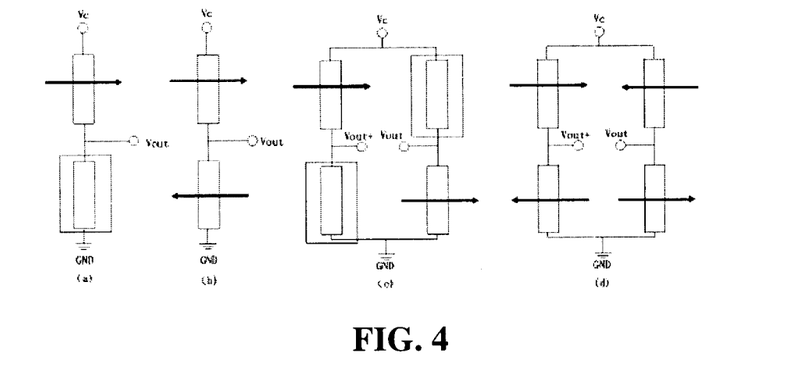
FIG. 4 is a structural diagram of a magnetoresistive sensor.

FIG. 4 is a structural diagram of a magnetoresistive sensor. FIG. 4a shows a reference half-bridge structure; FIG. 4b shows a push-pull half-bridge structure; FIG. 4c shows a reference full-bridge structure; and FIG. 4d shows a push-pull full-bridge structure. Moreover, quasi-bridge structures are further included.

Embodiment 4

Figure 5:
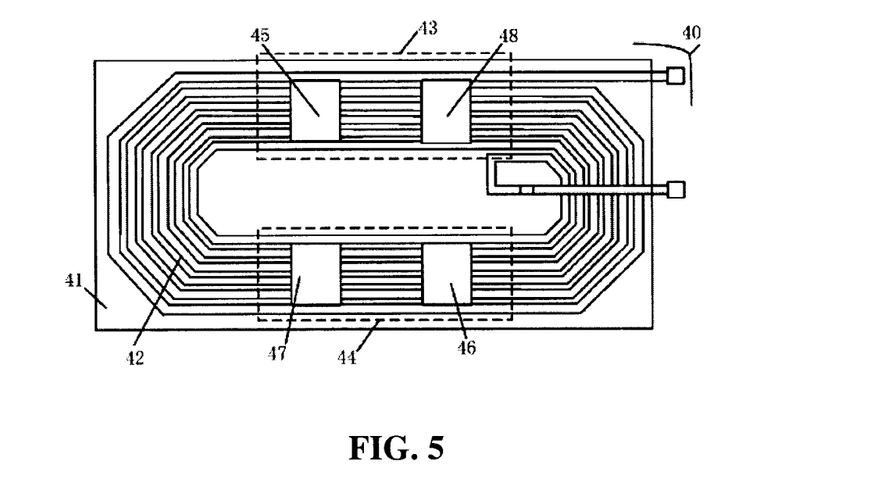
FIG. 5 is a first distribution structural diagram of a planar spiral coil and a magnetoresistive sensor.
Figure 6:
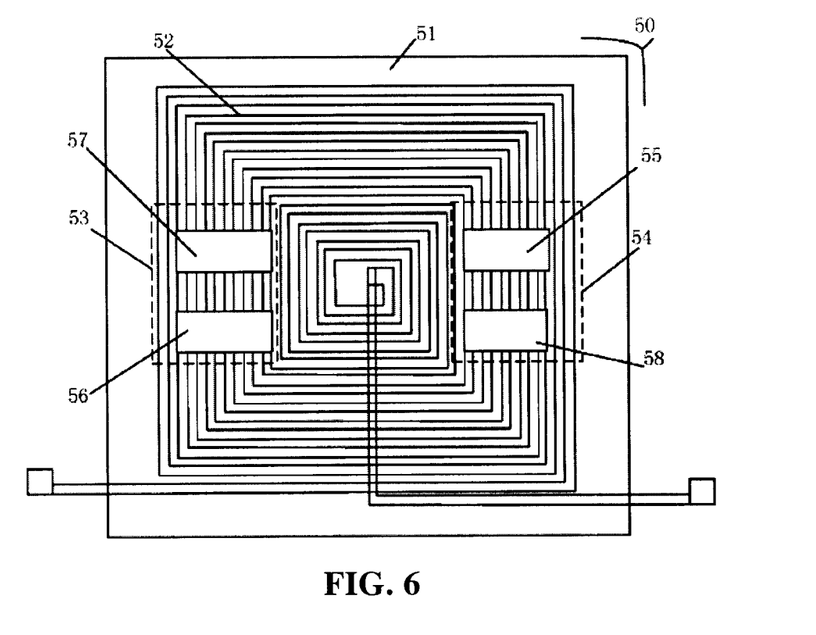
FIG. 6 is a second distribution structural diagram of a planar spiral coil and a magnetoresistive sensor.

FIG. 5 and FIG. 6 are diagrams showing two typical planar spiral coils and distribution of magnetoresistive sensors on the planar coils. In structures 40 and 50, 41 and 51 denote magnetic shielding layers, 42 and 52 both denote spiral coils, where 42 is of a polygon structure, 52 is of a quadrilateral structure, 42 includes two section regions 43 and 44, 52 includes two section regions 53 and 54, the two regions 43 and 44 and the two regions 53 and 54 each include multiple section of elongated straight wires. The elongated straight wires have identical lengths and widths, adjacent elongated straight wires are separated by identical intervals, and elongated straight wires in two regions have opposite current directions. Therefore, the two regions 43 and 44 and the two regions 53 and 54 each have symmetric magnetic field distribution features, that is, magnetic field distribution features perpendicular to the current direction in the two regions are opposite, and this provides conditions for placement of push arms and pull arms of the push-pull magnetoresistive sensor.

In the structures 40 and 50, the push-pull magnetoresistive sensor is of a full-bridge structure, and includes 2 push arms and 2 pull arms, thus forming four regions in total. In the structure 40, the push region 43 includes two sub-regions 45 and 48 for placing push arms, and the pull region 44 includes two sub-regions 46 and 47 for placing pull arms. In the structure 50 in the drawing, the push region 53 includes two sub-regions 57 and 56 for placing push arms, and the pull region 54 includes two sub-regions 55 and 58 for placing pull arms.

Figure 7:
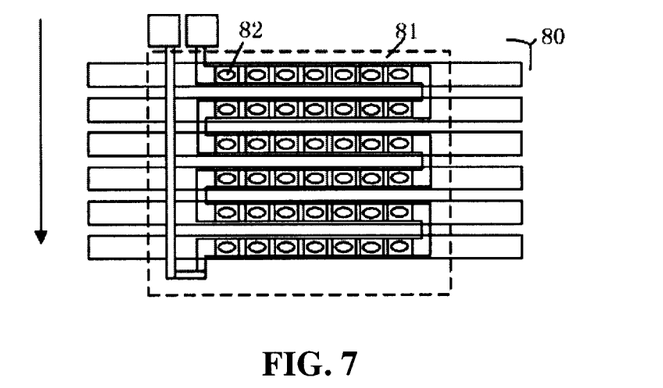
FIG. 7 is a first distribution diagram of a magnetoresistive sensor array on a coil.
Figure 8:
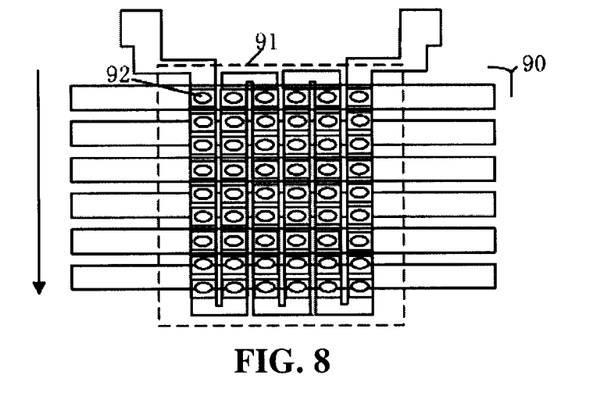
FIG. 8 is a second distribution diagram of a magnetoresistive sensor array on a coil.

FIG. 7 and FIG. 8 are diagrams showing arrangements and connections of magnetoresistive sensing units in the push arm region or pull arm region. The magnetoresistive sensing units are arranged into an array. All the magnetoresistive sensing units have magnetic sensitive directions perpendicular to the current direction, and form push arm structures or pull arm structures at two ports by parallel connection or serial connection. In FIG. 7 and FIG. 8, the magnetoresistive sensing units are serially connected to form magnetoresistive sensing unit strings, which are then serially connected to form a two-port structure.

In FIG. 7, the magnetoresistive sensing unit strings are parallel to the elongated straight wires, and in FIG. 8, the magnetoresistive sensing unit strings are perpendicular to the elongated straight wire. It should be pointed out that the magnetoresistive sensing units are placed directly above or directly below coils in the region. The magnetoresistive sensing units may be placed directly above or directly below centers of the wires, and may also be placed apart from central positions, for example, placed at gaps of the wires. This is because although magnetic fields sensed by the magnetoresistive sensing units are different, magnetic field magnitudes at different places are all proportional to the current intensity of the coil; therefore, the total resistance of the push arm and the pull arm is also proportional to the current intensity. The magnetoresistive sensing units in the regions where the push arms and the pull arms are located have completely identical distributions of the elongated straight wire; therefore, the total resistance changes of the push arm and the pull arm are completely identical, and the output of the whole push-pull full-bridge magnetoresistive sensor will be proportional to the amplitude change of the current.

Embodiment 5

Figure 9:
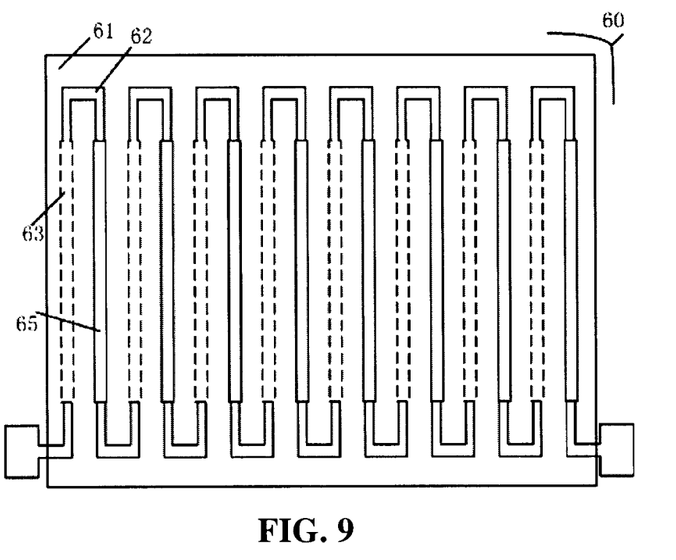
FIG. 9 is a distribution structural diagram of a twisted planar coil and a push-pull magnetoresistive sensor.
Figure 10:
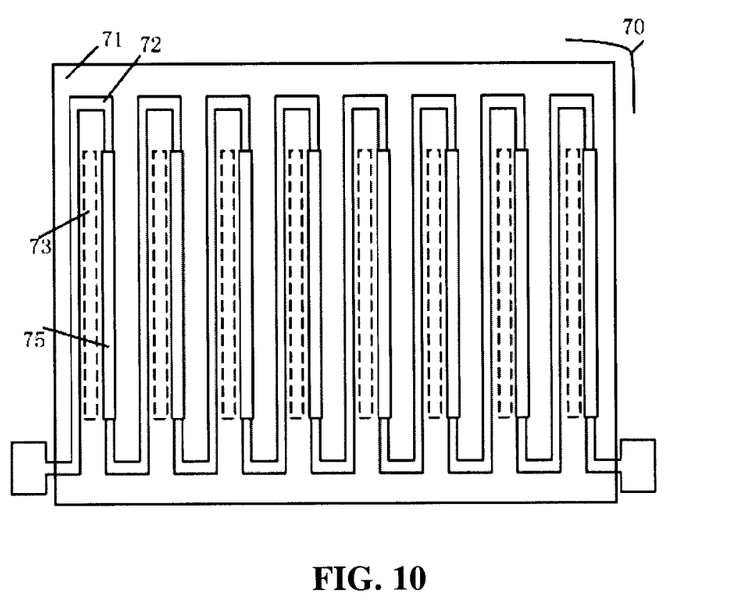
FIG. 10 is a distribution structural diagram of a twisted planar coil and a reference bridge magnetoresistive sensor.

FIG. 9 and FIG. 10 show distribution features of a twisted planar coil and magnetoresistive sensing unit strings of a magnetoresistive sensor. In the structural diagrams 60 and 70 respectively corresponding to FIG. 9 and FIGS. 10, 61 and 71 denote magnetic shielding layers, and 62 and 72 denote twisted planar coils, including multiple elongated straight wires arranged in parallel at equal intervals. The elongated straight wires have identical lengths and widths, and adjacent two elongated straight wires are connected in series but have opposite current directions. In FIG. 10, push magnetoresistive sensing unit strings 63 and pull magnetoresistive sensing unit strings 65 are alternately placed directly above or directly below the adjacent two elongated straight wires. Then, the push magnetoresistive sensing unit strings and the pull magnetoresistive sensing unit strings are respectively interconnected to form a push arm and a pull arm. The push arm and the pull arm are interconnected to form a push-pull bridge stricture. FIG. 10 corresponds to a magnetoresistive sensor of a reference bridge structure, wherein reference magnetoresistive sensing unit strings 73 and sensitive magnetoresistive sensing unit strings 75 are alternately placed at a central position between two adjacent elongated straight wires, and directly above or directly below the elongated wires adjacent to the central position and both have forward currents or reverse currents.

Embodiment 6

Figure 11:
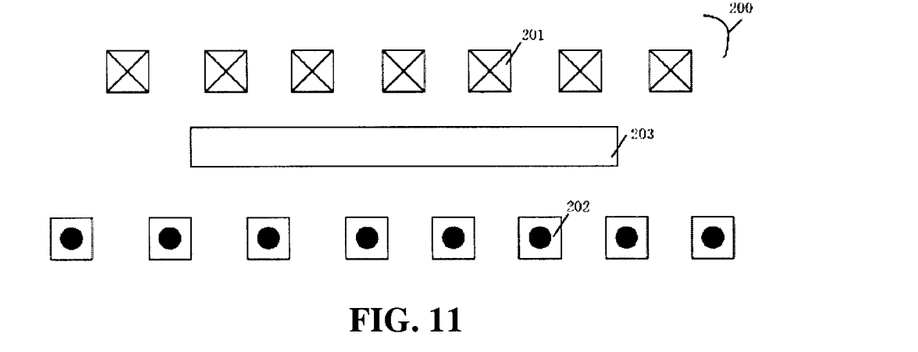
FIG. 11 is a structural diagram of a three-dimensional solenoid coil and a reference bridge magnetoresistive sensor.
Figure 12:
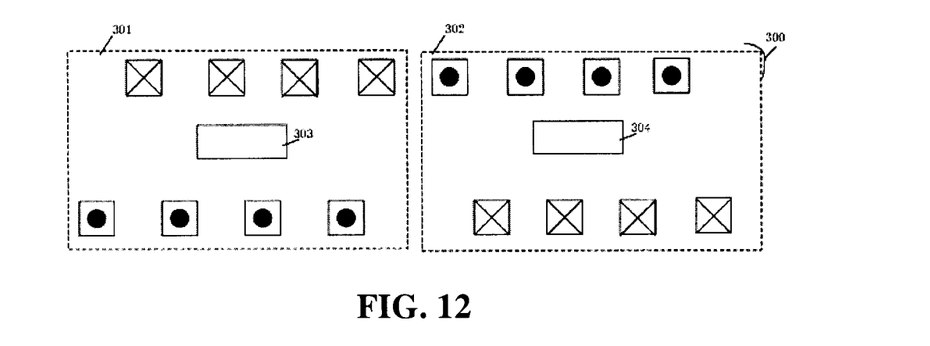
FIG. 12 is a structural diagram of a three-dimensional solenoid coil and a push-pull magnetoresistive sensor.

FIG. 11 and FIG. 12 are distribution structural diagrams of a three-dimensional coil and magnetoresistive sensing unit strings. In a structure 200, current directions of a top coil 201 and a bottom coil 202 included in the three-dimensional coil have opposite current directions, as shown in the drawings. 203 denotes a reference bridge magnetoresistive sensor. A reference arm of the reference bridge magnetoresistive sensor includes a ferromagnetic shielding layer, specifically a soft ferromagnetic flux shielding layer. The three-dimensional coil may be a solenoid coil or referred to as a three-dimensional solenoid.

The three-dimensional solenoid of FIG. 12 includes two solenoids 301 and 302 wound in opposite directions. A push magnetoresistive sensing unit 303 and a pull magnetoresistive sensing unit 304 are respectively placed in the solenoids 301 and 302, and since the two have opposite magnetic field directions, a push-pull magnetoresistive sensor bridge is formed.

Embodiment 7

Figure 13:
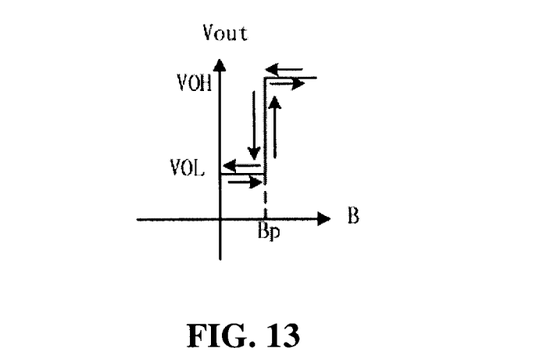
FIG. 13 is a diagram of a single-point operation mode of a magnetoresistive relay.

FIG. 13 to FIG. 16 respectively show four operation modes of a magnetoresistive relay. FIG. 13 shows a single-point operation mode, in which the switch integrated circuit switches from an off state to an on state only when the forward current of the excitation coil is greater than Ion-off, and the switch integrated circuit switches from the on state to the off state only when the forward current of the excitation coil is less than Ion-off.

Figure 14:
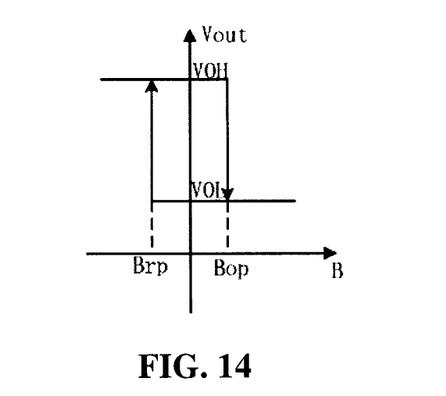
FIG. 14 is a diagram of a bipolar operation mode of a magnetoresistive relay.

FIG. 14 shows a bipolar operation mode, in which the switch integrated circuit switches from an off state to an on state only when the forward current of the excitation coil is greater than Ion, and the switch integrated circuit switches from the on state to the off state only when the forward current of the excitation coil is less than Ioff.

Figure 15:
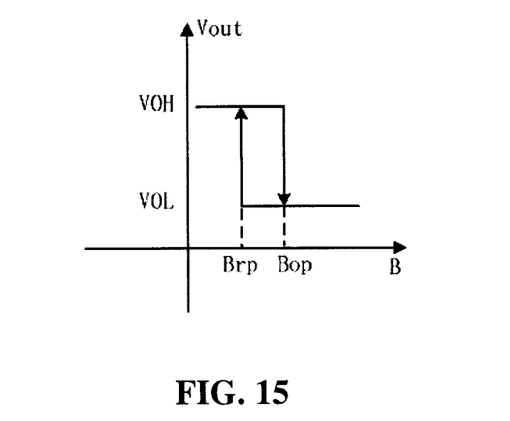
FIG. 15 is a diagram of a unipolar operation mode of a magnetoresistive relay.

FIG. 15 shows a unipolar operation mode, in which the switch integrated circuit switches from an off state to an on state only when the forward current of the excitation coil is greater than Ion, and the switch integrated circuit switches from the on state to the off state only when the reverse current of the excitation coil is greater than Ioff.

Figure 16:
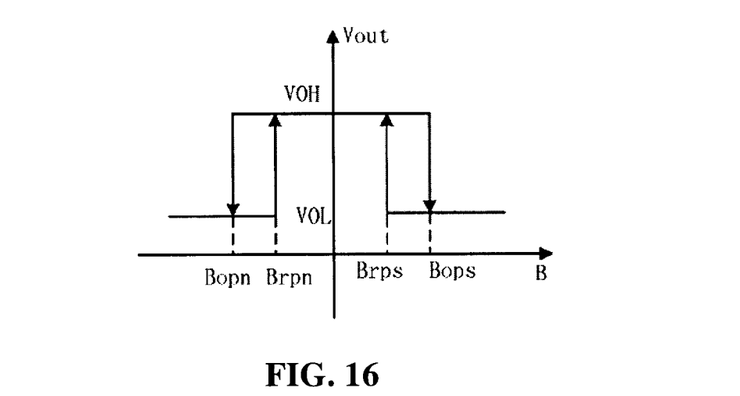
FIG. 16 is a diagram of an omnipolar operation mode of a magnetoresistive relay.

FIG. 16 shows an omnipolar operation mode, in which the switch integrated circuit switches from an off state to an on state when the forward current of the excitation coil is greater than Ion1, and the switch integrated circuit switches from the on state to the off state when the forward current of the excitation coil is less than Ioff1; or the switch integrated circuit switches from an off state to an on state when the reverse current of the excitation coil is greater than −Ion1, and the switch integrated circuit switches from the on state to the off state when the reverse current of the excitation coil is less than −Ioff1.

Embodiment 8

Figure 17:
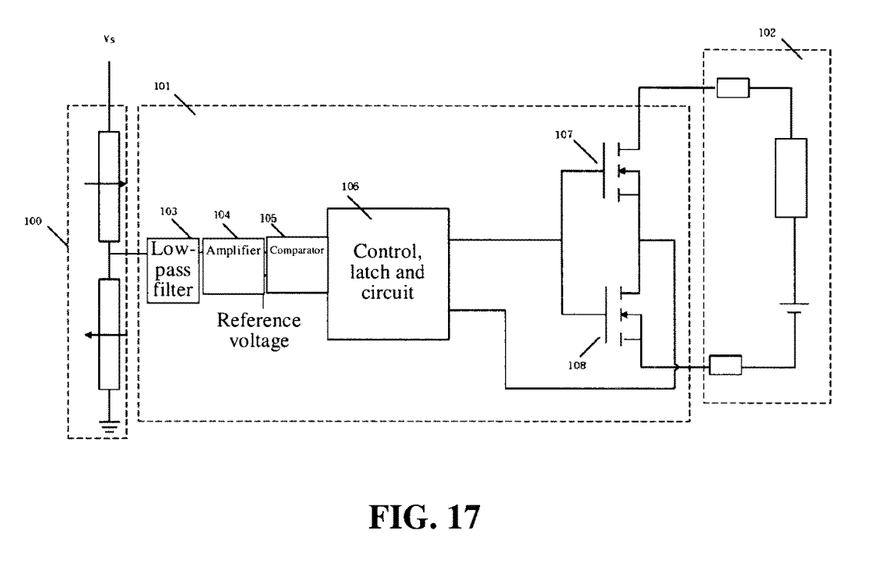
FIG. 17 is a signal processing diagram of a magnetoresistive relay.

FIG. 17 is a signal processing diagram of a magnetoresistive relay. In the drawing, 100 denotes a magnetoresistive sensor, which is a half-bridge magnetoresistive sensor in this embodiment, 101 denotes a switch integrated circuit, and 102 denotes an external circuit. An output signal of the magnetoresistive sensor 100 is denoised after passing through a low-pass filter 103, and then amplified by an amplifier 104. The signal is compared with a reference voltage by a comparator 105, and the signal is output to a latch, control and drive circuit 106. In an MOSFET tube switch formed by drives 107 and 108, the gates of two MOSFET tubes 107 and 108 are interconnected, a source of 107 and a drain of 108 are interconnected, and the two interconnections are polarly connected to an output end of 106. The external circuit 102 is connected to a drain of 107 and a source of 108. During operation, a magnetic response signal output by the magnetoresistive sensor 100 of the magnetoresistive relay passes the filter 103, the amplifier 104 and the comparator 105, to be transformed into a control, latch, and drive signal of 106, to control the on/off of the switch formed by the two MOSFET tubes 107 and 108, such that switch operation of the external circuit 102 can be realized.

Specific embodiments of the present invention are described with reference to the accompanying drawings. It is apparent that many modifications can be made to the prior art and the method without departing from the scope and spirit of the present invention. In the technical field of the present invention, diversified variations can be made within the scope of the technical field of the present invention as long as common knowledge is acquired.

The invention claimed is:

1. A magnetoresistive relay, comprising:
    a substrate and a magnetic excitation coil, a magnetoresistive sensor, and a switch integrated circuit which is placed on the substrate, and
    further comprising an excitation signal input electrode, an excitation signal output electrode, a switch circuit positive output electrode, a switch circuit negative output electrode, a power input electrode, and a ground electrode,
    wherein the ends of the magnetic excitation coil are each connected with the excitation signal input electrode and the excitation signal output electrodes,
    wherein the signal from the magnetoresistive sensor is sent to the switch integrated circuit,
    wherein the switch circuit positive output electrode and the switch circuit negative output electrode are respectively connected with the switch integrated circuit, and the power input ends and the ground ends of the switch integrated circuit and the magnetoresistive sensor are respectively connected with the power input electrode and the ground electrode,
    wherein, during operation, the magnetic field from the excitation coil provides an on/off signal, and the signal is used to change the magnetoresistance of the magnetoresistive sensor, and
    wherein the switch integrated circuit receives the signal from the magnetoresistive sensor, and from this the external output switching action is realized.

2. The magnetoresistive relay according to claim 1, wherein the magnetoresistive sensor is a TMR, a GMR, or an AMR magnetoresistive sensor.

3. The magnetoresistive relay according to claim 2, wherein the magnetoresistive sensor is a reference bridge magnetoresistive sensor or a push-pull bridge magnetoresistive sensor.

4. The magnetoresistive relay according to claim 3, wherein the reference bridge magnetoresistive sensor or the push-pull bridge magnetoresistive sensor is a full-bridge, half-bridge, or quasi-bridge structure.

5. The magnetoresistive relay according to claim 3, wherein the magnetic excitation coil is a planar coil or a three-dimensional coil.

6. The magnetoresistive relay according to claim 5,
wherein the planar coil is a spiral coil comprising two regions having opposite current directions,
wherein either of the regions comprises N elongated straight wires arranged in parallel,
wherein the elongated straight wires have identical lengths and widths, and
wherein the elongated straight wires are separated by identical intervals, N being a positive integer.

7. The magnetoresistive relay according to claim 6,
wherein a push arm and a pull arm of the push-pull magnetoresistive sensor are placed in the two regions of the spiral coil respectively,
wherein the push arm and the pull arm each comprise M magnetoresistive sensing unit strings,
wherein any of the magnetoresistive sensing unit strings comprise K magnetoresistive sensing units,
wherein M*K magnetoresistive sensing units are interconnected to form a two-port structure, and
wherein sensitive axes of the magnetoresistive sensing units are perpendicular to the elongated straight wires of the region, and the position relationship between the magnetoresistive sensing units of the push arm in the corresponding region and the N elongated straight wires arranged in parallel is the same as the position relationship between the magnetoresistive sensing units of the pull arm in the corresponding region and the elongated straight wires arranged in parallel, M and K both being positive integers.

8. The magnetoresistive relay according to claim 6, wherein a reference arm and a sensitive arm of the reference bridge magnetoresistive sensor are both placed in a central region of the spiral coil, there is no wire in the central region, and a soft ferromagnetic flux shielding layer covers the reference arm.

9. The magnetoresistive relay according to claim 5,
wherein the planar coil comprises N elongated straight wires 1 and elongated straight wires 2 that are arranged alternately,
wherein the elongated straight wires 1 and the elongated straight wires 2 are parallel to each other, and any two adjacent elongated straight wires are separated by identical intervals,
wherein the ends of adjacent elongated straight wires 1 and elongated straight wires 2 are connected in series, and
wherein the elongated straight wires 1 and the elongated straight wires 2 have identical sizes but opposite current directions.

10. The magnetoresistive relay according to claim 9, wherein the push-pull magnetoresistive sensor comprises a push magnetoresistive sensing unit string and a pull magnetoresistive sensing unit string, and the push magnetoresistive sensing unit string and the pull magnetoresistive sensing unit string are placed above or below the elongated straight wires 1 and the elongated straight wires 2 alternately.

11. The magnetoresistive relay according to claim 9,
wherein the reference bridge magnetoresistive sensor comprises a reference magnetoresistive sensing unit string and a sensitive magnetoresistive sensing unit string,
wherein the sensitive magnetoresistive sensing unit string is placed directly above or directly below a middle position of the adjacent elongated straight wire 1 and elongated straight wire 2, and
wherein the sensitive magnetoresistive sensing unit string is placed directly above or directly below the elongated straight wire 1 or elongated straight wire 2.

12. The magnetoresistive relay according to claim 1, further comprising a magnetic shielding layer, wherein the magnetoresistive sensor is placed between the magnetic shielding layer and the magnetic excitation coil.

13. The magnetoresistive relay according to claim 5,
wherein the three-dimensional coil is a solenoid coil,
wherein the reference bridge magnetoresistive sensor comprises a reference magnetoresistive sensing unit string and a sensitive magnetoresistive sensing unit string, and
wherein the reference magnetoresistive sensing unit string and the sensitive magnetoresistive sensing unit string are placed separately along the axis of the solenoid.

14. The magnetoresistive relay according to claim 5,
wherein the three-dimensional coil comprises two solenoid coils connected in series, and the two solenoid coils have opposite winding directions,
wherein the push-pull magnetoresistive sensor comprises a push magnetoresistive sensing unit string and a pull magnetoresistive sensing unit string, and
wherein the push magnetoresistive sensing unit string and the pull magnetoresistive sensing unit string are placed separately along the axes of the two solenoids.

15. The magnetoresistive relay according to claim 1, wherein
if the operation mode of the magnetoresistive relay is a single-point operation mode, the switch integrated circuit switches from an off state to an on state only when the forward current of the excitation coil is greater than Ion-off, and the switch integrated circuit switches from the on state to the off state only when the forward current of the excitation coil is less than Ion-off;
or, if the operation mode of the magnetoresistive relay is a bipolar operation mode, the switch integrated circuit switches from an off state to an on state only when the forward current of the excitation coil is greater than Ion, and the switch integrated circuit switches from the on state to the off state only when the forward current of the excitation coil is less than Ioff;
or, if the operation mode of the magnetoresistive relay is a unipolar operation mode, the switch integrated circuit switches from an off state to an on state only when the forward current of the excitation coil is greater than Ion, and the switch integrated circuit switches from the on state to the off state only when the reverse current of the excitation coil is greater than Ioff;
or, if the operation mode of the magnetoresistive relay is an omnipolar operation mode, the switch integrated circuit switches from an off state to an on state when the forward current of the excitation coil is greater than Ion1, and the switch integrated circuit switches from the on state to the off state when the forward current of the excitation coil is less than Ioff1;
or the switch integrated circuit switches from an off state to an on state when the reverse current of the excitation coil is greater than −Ion1, and the switch integrated circuit switches from the on state to the off state when the reverse current of the excitation coil is less than −Ioff1.

16. The magnetoresistive relay according to claim 1,
wherein the switch integrated circuit comprises a low-pass filter, an amplifier, a comparator, a drive latch control circuit, and an MOSFET tube,
wherein the low-pass filter is connected with an output signal of the magnetoresistive sensor, the amplifier is connected with the low-pass filter, and the comparator is connected with the amplifier,
wherein an output result of the comparator is transmitted to the drive latch control circuit, and the drive latch control circuit drives the on/off of the MOSFET tube, and
wherein the MOSFET is connected with the external circuit.

17. The magnetoresistive relay according to claim 16,
wherein there are two MOSFET tubes, the gates of the two MOSFET tubes are interconnected, a source of one of the MOSFET tubes is interconnected with a drain of the other MOSFET tube, and the two interconnected gates are connected with the drive latch control circuit respectively, and
wherein the remaining source and drain ends of the two MOSFET tubes are connected with the external circuit.

* * * * *